(12) United States Patent
Scholder

(10) Patent No.: US 8,519,745 B2
(45) Date of Patent: Aug. 27, 2013

(54) METHODS AND SYSTEMS FOR DETECTION OF ZERO CROSSINGS IN A SIGNAL

(75) Inventor: William Scholder, Rockaway, NJ (US)

(73) Assignee: ASCO Power Technologies, L.P., Florham Park, NJ (US)

( * ) Notice: Subject to any disclaimer, the term of this patent is extended or adjusted under 35 U.S.C. 154(b) by 0 days.

(21) Appl. No.: 13/479,102

(22) Filed: May 23, 2012

(65) Prior Publication Data

US 2012/0229170 A1    Sep. 13, 2012

Related U.S. Application Data

(63) Continuation of application No. 12/685,423, filed on Jan. 11, 2010, now Pat. No. 8,248,109.

(51) Int. Cl.
*H03K 5/22* (2006.01)
*H03K 5/153* (2006.01)

(52) U.S. Cl.
USPC ............................................. 327/79; 327/78

(58) Field of Classification Search
USPC ..................................................... 327/78, 79
See application file for complete search history.

(56) References Cited

U.S. PATENT DOCUMENTS

| 4,413,908 | A | 11/1983 | Abrams et al. | |
|---|---|---|---|---|
| 4,749,879 | A * | 6/1988 | Peterson et al. | 327/79 |
| 4,882,740 | A | 11/1989 | Abe et al. | |
| 6,157,264 | A | 12/2000 | Adkins | |
| 6,272,184 | B1 | 8/2001 | Ta et al. | |
| 6,768,615 | B2 * | 7/2004 | Liu | 361/2 |
| 8,248,109 | B2 | 8/2012 | Scholder | |

* cited by examiner

*Primary Examiner* — John Poos
(74) *Attorney, Agent, or Firm* — McDonnell Boehnen Hulbert & Berghoff LLP

(57) ABSTRACT

Methods and systems for detection of zero crossings in a signal are described. For example, true zero crossings in an alternating voltage power source signal can be detected in the presence of noise pulses. The zero crossing detections are performed by establishing a value of a signal status counter, and at a repeating interval if the signal is a logic low value, the value of the signal status counter is decremented if the signal status counter is greater than a first value otherwise a flag is set to enable detection of a zero crossing in the signal. In addition, at the repeating interval, if the signal is a logic high value, the value of the signal status counter is incremented, and if after incrementing the signal status counter is equal to a second value and the flag is set, a zero crossing of the signal is declared.

9 Claims, 5 Drawing Sheets

Zero crossing signal with noise on low level

Zero crossing signal with noise on high level

Zero crossing signal with periodic noise

METHODS AND SYSTEMS FOR DETECTION OF ZERO CROSSINGS IN A SIGNAL

CROSS REFERENCE TO RELATED APPLICATIONS

The present application is a continuation of U.S. patent application Ser. No. 12/685,423 filed on Jan. 11, 2011, of which is entirely herein incorporated by reference.

FIELD

The patent disclosure generally relates to detecting zero crossings for an alternating voltage power source in the presence of noise pulses, and more particularly, to systems, methods, and devices for detecting and preventing false zero crossing identifications.

BACKGROUND

Zero-crossing point detection circuits are used for detecting instances at which a signal changes from a negative to a positive polarity and from a positive to a negative polarity. For example, in an alternating voltage signal (e.g., a sinusoidal source), a zero crossing is an instantaneous point at which there is no voltage present, such as when the signal transitions through zero. This occurs twice during each cycle.

Zero crossing detection circuits may be used in many instances, such as to detect a zero cross in solid state relays to turn on the solid state relay as close to the zero crossing as possible. Zero crossing detectors are also used in systems to coordinate operation. Devices plugged into AC power can keep track of the zero crossing to perform various timing dependant operations as each device sees the same AC power, for example.

As another example, an electronic control circuit for automatic transfer switches and pump controllers may require accurate zero crossing detection of AC power sources for computing root-mean-square (RMS) voltages, frequency, and in phase transfers. For applications with in phase transfers, the zero crossing signals are used to determine the appropriate time to initiate a transfer. As still other examples, the zero crossings for multiple phases in a three phase system can be used to determine phase rotation of the sources.

Besides the inconvenience and annoyance of false zero crossing signals, serious conditions can arise when false zero crossings occur. For example, RMS voltages can become inaccurate, switches can inappropriately transfer, phase rotation errors can result, and in some cases, transfers can be inhibited. False zero crossings for in phase transfers could cause damage to the equipment.

Do to the variable nature of anomalies that do not consistently appear in a signal, designs for zero crossing detectors may not consistently be effective in controlling false zero crossings. For example, power sources used for various applications often supply transient type loads, and noise sources are not consistently turned on. Therefore, a noise transient may be inserted into a signal and cause a false zero crossing detection.

SUMMARY

In one example aspect, a method of determining zero crossings in a signal is provided. The method includes receiving a time-varying signal, and establishing a value of a signal status counter. The method also includes at a repeating interval, if the signal is a logic low value, decrementing the value of the signal status counter if the signal status counter is greater than a first value, otherwise setting a flag to enable detection of a zero crossing in the signal. In one example, the first value may be zero; however, the first value may be as desired depending upon an application of the method. The method further includes at the repeating interval, if the signal is a logic high value incrementing the value of the signal status counter, and if the signal status counter is equal to a second value and the flag is set, determining a zero crossing of the signal. In one example, the second value may be set to five; however, the second value may be as desired depending upon an application of the method.

In another example aspect, a computer readable medium is provided that has instructions stored thereon that, in response to execution by a computing device, cause the computing device to perform operations for determining zero crossings in a signal. The operations include receiving a time-varying signal, and establishing a value of a signal status counter. The operations also include at a repeating interval, if the signal is a logic low value, decrementing the value of the signal status counter if the signal status counter is greater than a first value, otherwise setting a flag to enable detection of a zero crossing in the signal. The operations further include at the repeating interval, if the signal is a logic high value incrementing the value of the signal status counter, and if the signal status counter is equal to a second value and the flag is set, determining a zero crossing of the signal.

In yet another example aspect, a system is provided that includes an up/down counter for establishing a signal status counter, and a processor coupled to the up/down counter. The processor receives a power signal and identifies zero crossings in the power signal. At a repeating interval the processor determines if the power signal is a logic low value or a logic high value, and at the repeating interval if the signal is the logic low value the processor instructs the up/down counter to decrement a value of the signal status counter if the signal status counter is greater than a first value otherwise the processor sets a flag to enable detection of a zero crossing in the signal. In addition, at the repeating interval if the signal is the logic high value the processor instructs the up/down converter to increment the value of the signal status counter, and after incrementing if the signal status counter is equal to a second value and the flag is set the processor declares a zero crossing of the signal.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
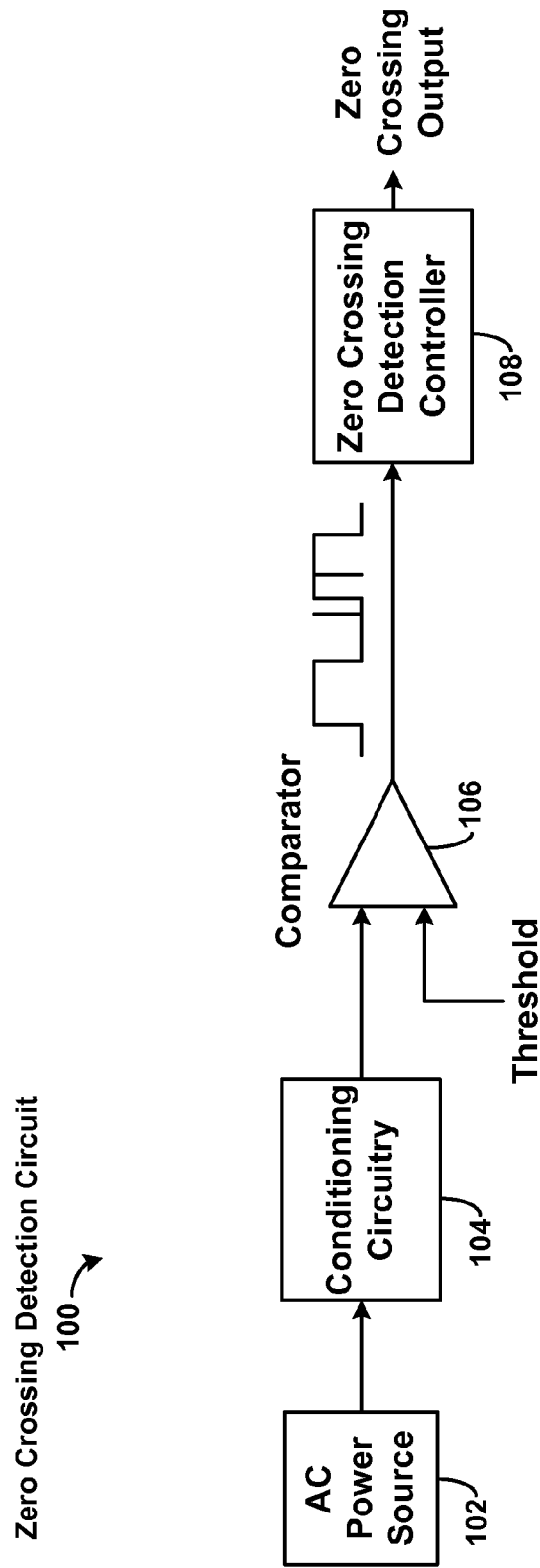
FIG. 1 illustrates a block diagram of an example zero crossing detection circuit.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that aspects of the present disclosure, as generally described herein, and illustrated in the Figures, can be arranged, substituted, combined, separated, and designed in a wide variety of different configurations, all of which are explicitly contemplated herein.

Methods and systems described herein provide examples of zero crossing detection methods and circuits that may prevent false zero crossing detections. For example, a zero crossing detection controller may be programmed with an algorithm tailored to identify noise transients within a signal and to identify a true zero-crossing of a signal. A decision to accept or reject a zero crossing is performed and may be delayed until conditions required by the algorithm have been satisfied, for example. Alternatively, a zero crossing detection controller may be configured using circuitry to perform functions of the algorithm. Still further, a combination of software and hardware may be used to perform aspects of the methods and systems described herein.

Example methods include to detect a zero crossing in a signal include establishing a value of a signal status counter, and at a repeating interval if the signal is a logic low value, the value of the signal status counter is decremented if the signal status counter is greater than a first value otherwise a flag is set to enable detection of a zero crossing in the signal. In addition, at the repeating interval, if the signal is a logic high value, the value of the signal status counter is incremented, and if after incrementing the signal status counter is equal to a second value and the flag is set, a zero crossing of the signal is declared. Other examples and modifications to the examples are described below.

Referring now to the figures, FIG. 1 illustrates a block diagram of an example zero crossing detection circuit 100. The zero crossing detection circuit 100 includes an AC power source 102 inputting an AC power signal to conditioning circuitry 104, which outputs to a comparator 106 with hysteresis. The comparator 106 provides a discrete signal output to a zero crossing detection controller 108, which identifies true zero crossings of the input AC power signal. The AC power source 102 may be any power source capable of outputting a sinusoidal power signal. For example, the AC power source 102 may be a 110 Volt AC power source. The conditioning circuitry 104 may include low pass filters to remove high-frequency noise, for example. The conditioning circuitry 104 may include other voltage regulators, voltage gain circuitry, or other circuitry to remove unwanted portions of the signal or provide the signal in a format for the comparator to transform the signal into the discrete signal of desired logic low and logic high values, for example.

The comparator 106 receives the output of the conditioning circuitry 104 and a threshold, and outputs a discrete signal to the zero crossing detection controller 108. The threshold input may be between about 0 Volts to about 5 Volts, however other voltages may be used as well. The comparator 106 may be configured to output an appropriate high or low signal at times when the output of the conditioning circuitry 104 is not equal to the threshold voltage, for example. The output of the comparator 106 may be a square wave, for example.

The zero crossing detection controller 108 receives the output of the comparator 106 and detects zero-crossing points of the discrete signal. The zero crossing detection controller 108 may include a sampling circuit to sample the square wave signal received from the comparator 106 to determine if the signal is a logic high or a logic low.

In one example, the zero crossing detection circuit 100 may be a portion of a controller (e.g., an automatic switch or pump controller) used to convert an AC power source into a discrete signal. For example, in an automatic transfer switch, which operates to switch load between two power sources, synchronization between the power sources is achieved by monitoring the zero cross transitions of the input power signal. Edge transitions of the input power signal are identified that indicates that the signal has gone through a zero crossing. The identified edge transitions are analyzed to identify true zero crossings, and to remove noise transients, for example. By tracking true zero crossings, synchronization between power sources can be achieved.

Figure 2A:
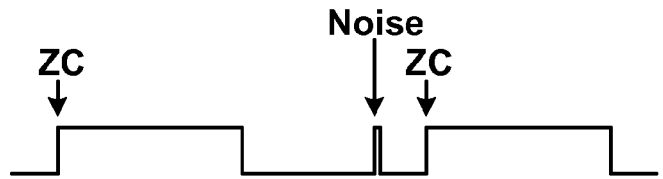
FIGS. 2A-2B include plots of example signals that include samples of possible noise pulses integrated into an original zero crossing signal.
Figure 2B:
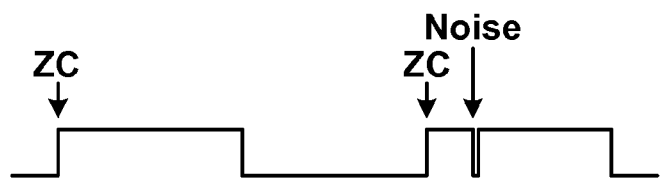

FIG. 2 includes plots of example signals that include samples of possible noise pulses integrated into an original zero crossing signal. In FIG. 2a, two true zero crossing (ZC) transitions are shown. Noise appears in the signal when the signal is low. The noise interruption causes a low to high transition that could be interpreted as a zero crossing event but should be ignored since the true zero crossing occurs at a later time. In FIG. 2b, again two true ZC transitions are shown, and in this example, noise appears in the signal when the signal is high. The ZC low to high transition is the true zero crossing and should be accepted. A subsequent low to high transition is a noise pulse and should be rejected. Each of the example instances illustrated in FIGS. 2A and 2B include zero crossing events that are caused by noise and should be rejected. Each of these examples can be evaluated in a different manner to identify true zero crossing events.

Figure 3:
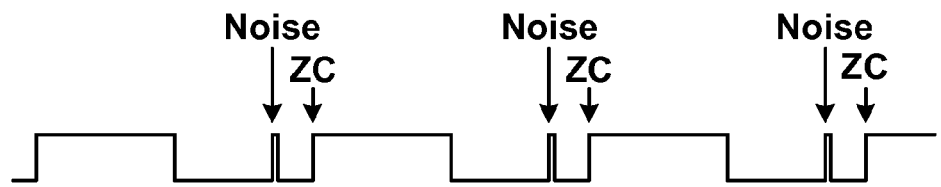
FIG. 3 includes a plot of an example signal that includes samples of possible noise pulses integrated into an original zero crossing signal.

FIG. 3 includes a plot of an example signal that includes samples of possible noise pulses integrated into an original zero crossing signal. In this example, it is assumed that the noise introduces a periodic waveform into the original zero crossing signal. It could be possible to lock onto the noise pulses (e.g., the noise waveform) instead of the true zero crossing because the noise pulses may occur at a proper time spacing. However, the noise pulses should be rejected as false zero crossing events. If the noise pulses were accepted as valid zero crossings, various problems could result. For example, a phase relationship between two power sources would be in error by an amount of time between the noise pulse and the true zero crossing signal. If this causes a phase rotation error, it is possible to inhibit a switch transfer. Also, for in phase transfers, the false zero crossings could initiate a transfer when the two sources are not in phase, and damage to equipment could result.

Figure 4:
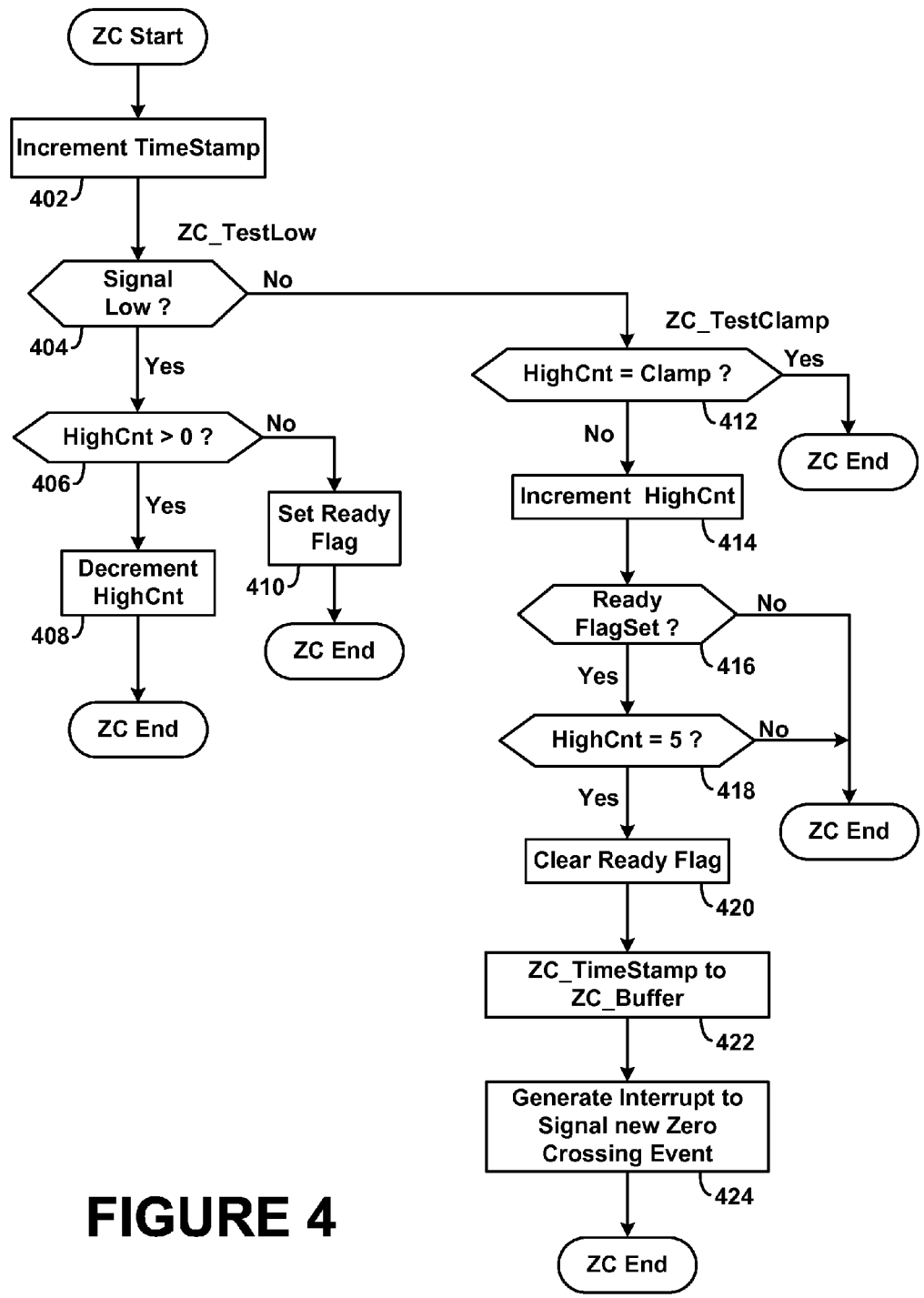
FIG. 4 is a flowchart depicting example steps of a method for identifying true zero crossing events.

FIG. 4 is a flowchart depicting example steps of a method for identifying true zero crossing events. It should be understood that the flowchart shows functionality and operation of one possible implementation of present embodiments. In this regard, each block may represent a module, a segment, or a portion of program code, which includes one or more instructions executable by a processor for implementing specific logical functions or steps in the process. The program code may be stored on any type of computer readable medium, for example, such as a storage device including a disk or hard drive. In addition, each block may represent circuitry that is wired to perform the specific logical functions in the process.

Alternative implementations are included within the scope of the example embodiments of the present application in which functions may be executed out of order from that shown or discussed, including substantially concurrent or in reverse order, depending on the functionality involved, as would be understood by those reasonably skilled in the art. Thus, the flow chart may exist as a software routine, firmware routine, as the product of a digital electronic circuit, or may exist as some combination thereof.

The flow chart describes a method that includes a processing loop that is repeated on a continuous basis or on a predefined repeating time interval based on an application of the method. A repeat time of the loop can be adjusted to satisfy requirements of an application, for example. On each pass through the method, a time stamp counter is incremented, as initially shown at block 402. The time stamp counter is used to measure a period between two zero crossing events (e.g., a most previously detected zero crossing and a presently detected zero crossing).

Next, a test is performed to determine if a signal is low or high (e.g., for a digital signal, whether the signal is a logic low value or a logic high value), as shown at block 404. A signal may be low (or a logic low value) if the signal is 0 Volts, or about 0 Volts, and a signal may be high (or a logic high value) if the signal is 5 Volts, or about 5 Volts. If the signal is low, a signal status counter, referred to as HighCnt, is evaluated to determine if the counter HighCnt is greater than zero, as shown at block 406. If the counter HighCnt is greater than zero, the counter HighCnt is decremented by one unit, as shown at block 408, and the processing loop is completed and will be restarted at block 402 after expiration of the repeat time of the loop. The counter HighCnt is used to determine when to enable validation of a zero crossing event, and also, when to declare a true zero crossing.

If the counter HighCnt is not greater than zero, and thus is equal to zero, a flag called Ready is set, as shown at block 410. In one example, the Ready flag needs to be set to enable validation of a zero crossing, for example. Thus, the Ready flag can be a condition precedent to validating a true zero crossing event.

Returning back to block 404, if the signal is high, the counter HighCnt is compared to a value referred to as Clamp, and if the counter HighCnt value equals the Clamp value, then the loop is completed, as shown at block 412, and will be restarted at block 402. The Clamp value may be set to a predefined threshold value when counting up, such as ten. Additionally, when counting down, the value of HighCnt may not go below zero. The test shown in block 412 is performed to determine if the value of HighCnt has reached a maximum, and if so, the loop is restarted.

If the counter HighCnt is not equal to the Clamp value (e.g., HighCnt is less than the Clamp value), then the counter HighCnt is incremented by one, as shown at block 414. Next, if the Ready flag is set, as shown at block 416, a test is made to determine if the counter HighCnt is equal to a predefined time value (e.g., in one example, the value is 5), as shown at block 418. If the Ready flag is not set or if the counter HighCnt does not equal the predefined time value, then the processing loop ends and will be restarted at block 402 after expiration of the repeat time of the loop. The predefined time value is set according to a time necessary for the signal to be a logic high before a true zero crossing event is declared, for example.

If the counter HighCnt is equal to the predefined time value and the ready flag is set, a valid zero crossing event is declared. The Ready Flag is then cleared, as shown at block 420, a time stamp of the zero crossing event is saved in a buffer (e.g., ZC_Buffer), as shown at block 422, and an interrupt is generated to signal a new zero crossing event has been detected, as shown at block 424. It can be seen that before a next zero crossing can be acknowledged, the zero crossing signal transitions low and remains low for a sufficient time so that the counter HighCnt can decrement to zero to enable the Ready flag.

A loop execution time may be determined based on an application of the method. For example, to measure a phase rotation based on zero-crossing events, a loop execution time of about 2 microseconds may be used. Thus, every 2 microseconds, the method of FIG. 4 is executed. In this manner, with a predefined time value of 5, for example as shown at block 418, the signal would need to remain a logic high for a total of about 10 microseconds (e.g., 5 executions of the loop) for a zero crossing to be valid. A loop execution time of about 2 microseconds, for example, may be a sufficient value since noise is usually a high frequency, and 10 microseconds has been determined to be sufficient to remove the noise. However, the predefined time value may be set to a higher or lower number of counts as appropriate.

In addition, to determine that a zero crossing is valid, the signal would need to remain a logic high for a given amount of time (e.g., equal to the timer value), and the Ready flag needs to be set. In the example method shown in FIG. 4, both conditions are necessary to validate a zero crossing. Other example methods for identifying a true zero crossing may include measuring a time period between zero crossings, and determining if the time period is within a valid range. However, such a method may fail, for example, if a noise pulse is included in the measurement. For example, referring back to FIG. 2A, if a time from the noise pulse to the subsequent true zero crossing is measured, it may be determined that the time is too small for a period of the signal, and thus, the true zero crossing may be rejected as false. Thus, according to example methods and systems herein, an additional condition of the Ready flag being set is introduced to further help prevent false zero crossing detections.

Using the method of FIG. 4, a decision to accept or reject a zero crossing will be delayed until conditions required by the method have been satisfied. Thus, validation of a true zero crossing event is delayed for a given amount of time after the low to high transition that defines the zero crossing. In applications such as an automatic switch transfer, in which a phase of two power sources is being measured to determine when to switch a load from a first to a second power source, the delay of the validation will be the same for each power source. Thus, a measure of a period (time between zero crossings) for each power source will be the same, and a switch between power sources can be effectively synchronized.

In other applications, a minimal delay may be acceptable. For example, in an automatic switch transfer in which one power source is a conventional primary power provided by a power utility company and a backup power source is provided by a generator, when the primary power goes down, a phase of a power signal provided by the backup generator may not be in phase with the primary power signal. To perform a load transfer to the backup power source, an in phase transfer may be needed, and can be performed by analyzing zero crossings of the two power signals. An in phase transfer should be performed so that the load is transferred to the backup power signal at a time when the backup power signal is within about 60° of the power signal from the primary power source so as to avoid transient voltages and rush currents.

A prediction of the phase of the backup power source is made by analyzing zero crossings of the power signal from the backup power source. The backup power source will have a 60 Hz signal, which provides a period of 16 ms. To be within about 60° of the power signal from the primary power source, the transfer would need to occur within about 1/6 of the period of the signal (e.g., transfer needs to occur within less than about 3 ms of the period). Thus, if validation of a zero crossing event is delayed by about 200 microseconds to about 300 microseconds, a transfer may safely occur within a toleration of about 5° to about 10° of the 60° allowance, for example. In this example, a minimal delay is acceptable.

In other applications, delays of about 500 microseconds to about 1 ms may be desired. Using the method shown in FIG. 4, and a predefined timer value of 5 counts with a loop execution time of 2 microseconds, a delay would be about 10 microseconds. Thus, the predefined timer value can be set according to an acceptable amount of delay.

In addition, the predefined timer value may be set based on a maximum pulse width of an expected noise transient. For example, if a noise transient is less than 10 microseconds, a predefined timer value of 5 and a loop execution time of 2 microseconds will be successful to validate a zero crossing. However, if a noise transient is expected to be up to 20 microseconds in length, the predefined timer value may be adjusted to be 10 counts with a loop execution time of 2 microseconds so that a signal needs to remain a logic high for 20 microseconds before a zero crossing can be validated.

Figure 5:
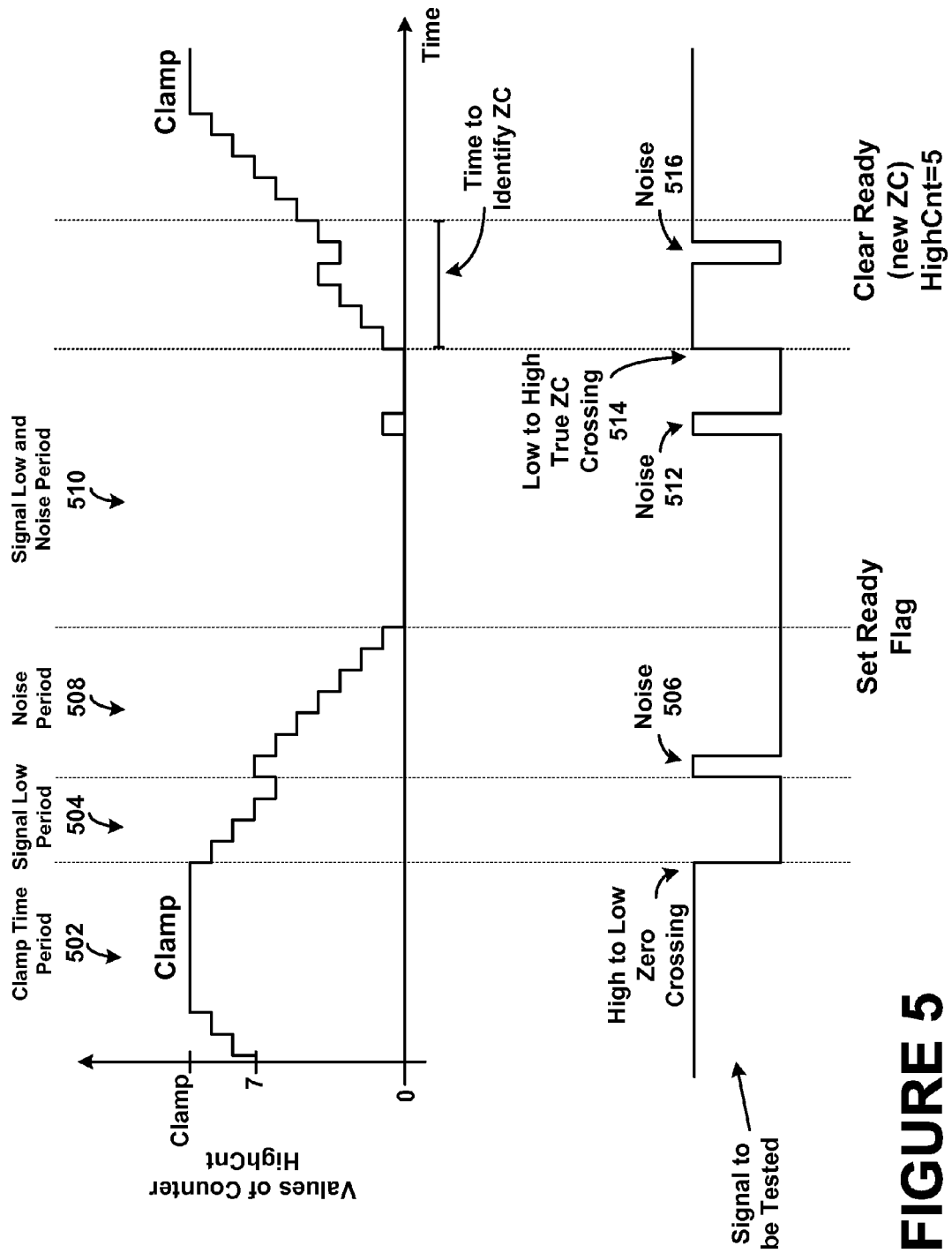
FIG. 5 illustrates a plot of an example signal to be tested, and an example plot of a signal status as described in the method of FIG. 4.

FIG. 5 illustrates a plot of an example signal to be tested, and a plot of the counter HighCnt as described in the method of FIG. 4. The plot of the counter HighCnt is shown at the top of FIG. 5. The signal to be tested may be a signal from a power source that has been processed by a zero crossing detection circuit, such as the circuit 100 in FIG. 1, so that the signal has been transformed from a sinusoidal power signal into the square wave signal as illustrated in FIG. 5.

The counter HighCnt may initially be set at a value of zero, for example. In this example, the counter HighCnt is at a value of 7 to begin. The method of FIG. 4 is executed to identify true zero crossings when the signal transitions from a logic low signal to a logic high signal. The signal may be tested every 2 microseconds, for example. As shown in the flowchart of FIG. 4, each time the signal is tested, if the signal is not a logic low value, the counter HighCnt is incremented until the counter HighCnt reaches a maximum of the clamp value (e.g., in this example the clamp value is set to 10). Thus, during a time period 502, the counter HighCnt is incremented each time the signal is tested. Once the signal transitions to a logic low, the method of FIG. 4 indicates to decrement the counter HighCnt as long as the counter HighCnt is greater than zero. In the example of FIG. 5, during a time period 504, the counter HighCnt is decremented four times.

A noise pulse 506 is found in the signal and causes the counter HighCnt to be incremented by one value. Subsequently, during a time period 508, the signal returns to a logic low value and the counter HighCnt is decremented seven times down to zero. When the signal is tested again, with the counter HighCnt at a value of zero and the signal at a logic low value, the Ready Flag will be set and a subsequent logic high pulse will be eligible for validation of a true low to high zero crossing.

During a time period 510, a noise pulse 512 causes the counter HighCnt to be incremented by one value, but since the method of FIG. 4 requires the counter HighCnt to be at a value of five, the noise pulse 512 will not trigger validation of a zero crossing. A low to high true zero crossing 514 may then occur. The counter HighCnt will be incremented a number of times, up to four in this example, until a noise pulse 516 is encountered. The noise pulse 516 causes the counter HighCnt to be decremented, however, after two more iterations of the loop, the counter HighCnt is at a value of five, and the method of FIG. 4 indicates to declare a true zero crossing event. The Ready Flag is then cleared, and the method of FIG. 4 begins again. The counter HighCnt is not reset, and will continue to be incremented to the clamp value as long as the signal remains a logic high value.

As shown in the plot of FIG. 5, a true zero crossing event is not declared until 12 microseconds (assuming a loop processing time of 2 microseconds) after the zero crossing occurred. The delay is based upon the loop processing time of the method, and also in this example, is lengthened due to the noise pulse 516 introduced into the signal.

Figure 6:
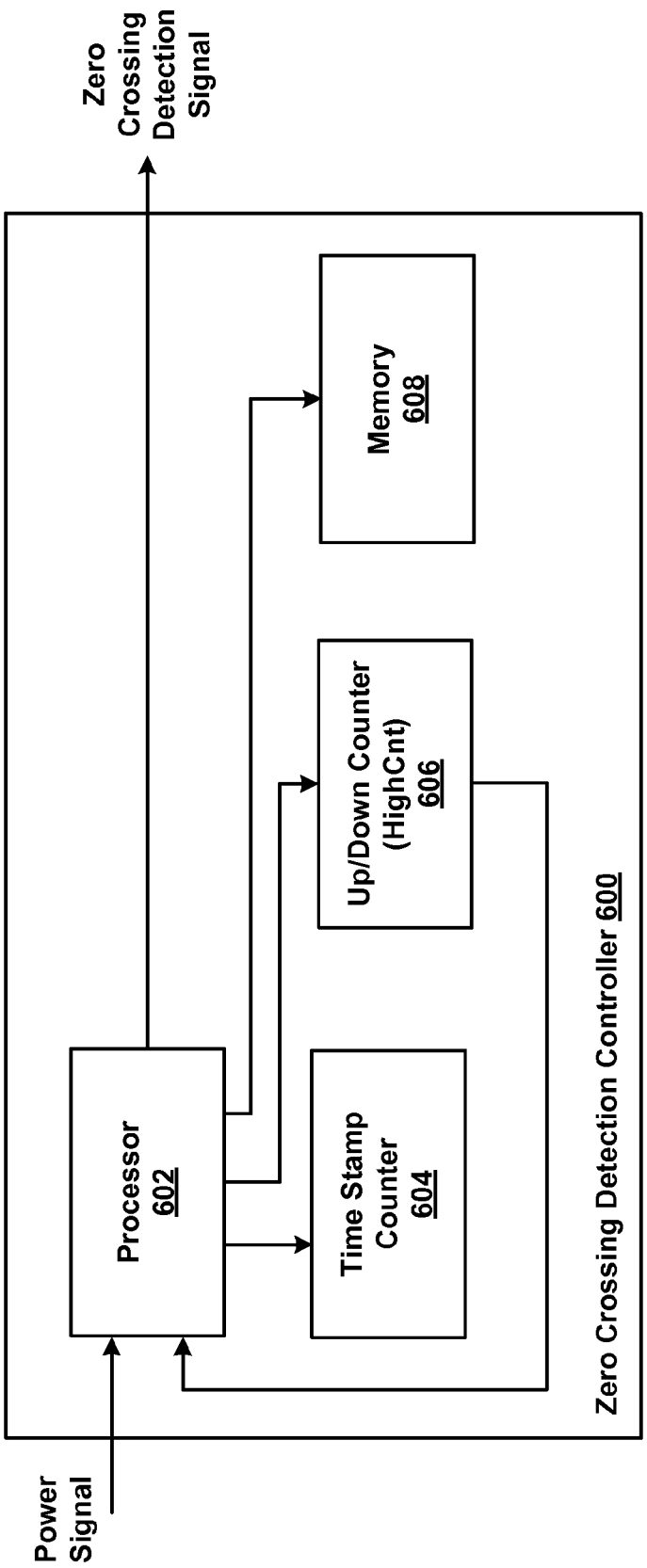
FIG. 6 is a block diagram illustrating an example zero crossing detection controller.

FIG. 6 is a block diagram illustrating an example zero crossing detection controller 600. The zero crossing detection controller 600 includes a processor 602 coupled to a time stamp counter 604, an up/down counter 606, and memory 608. The zero crossing detection controller 600 may take the form of an integrated circuit, where each component is hardwired to perform functions described below. In addition, each component may represent a module, a segment, or a portion of program code, which includes one or more instructions executable by the processor 602 for implementing specific logical functions or steps in the process.

The processor 602 may receive a sinusoidal power signal and identify zero crossings in the power signal. The processor 602 may alternatively receive a power signal in the form of a square wave signal. Additionally, other forms of pre-processing may be performed on a power signal before the processor 602 receives the signal. The zero crossing detection controller 600 may include more than one processor 602, and depending on a desired configuration, the processor 602 can be of any type including but not limited to a microprocessor (μP), a microcontroller (μC), a digital signal processor (DSP), or any combination thereof. A resolution of a validation of a zero crossing may be based upon a loop execution time. Thus, the zero crossing detection controller 600 may include a second high end timer processor to execute portions of the method of FIG. 4 separate from the processor 602, for example.

The processor 602 may execute software instructions stored on the memory 608 to perform the method of FIG. 4, for example. The instructions may be stored on any type of memory or computer readable medium, for example, such as a storage device including a disk or hard drive. Thus, the processor 602 may test an incoming power signal about every 2 microseconds to identify zero crossings. Each time the processor 602 performs a test, the processor 602 may signal the time stamp counter 604. The time stamp counter 604 may maintain time stamps of the tests that can be used to measure a time from a last zero crossing to a present zero crossing, for example.

Following the method of FIG. 4, the processor 602 will determine if the signal is a logic low or a logic high value, and will signal to the up/down counter 606 to increment or decrement a value of HighCnt, for example. The up/down counter 606 tracks a status of the power signal by decrementing HighCnt when the power signal is a logic low and incrementing HighCnt when the power signal is a logic high, for example.

Once the value of HighCnt reaches a first appropriate level, the processor 602 will set a Ready Flag to true in the memory 608, and continue to test the incoming power signal. Similarly, once the value of HighCnt reaches a second appropriate level, the processor 602 will generate an interrupt signal to indicate a true zero crossing event if the Ready flag is set. When the zero crossing event is declared, values of the time stamp counter 604 can be saved to the memory 608, and the Ready flag is cleared.

It should be understood that this and other arrangements described herein are for purposes of example only. As such, those skilled in the art will appreciate that other arrangements and other elements (e.g. machines, interfaces, functions, orders, and groupings of functions, etc.) can be used instead, and some elements may be omitted altogether according to the desired results.

The present disclosure is not to be limited in terms of the particular embodiments described in this application, which are intended as illustrations of various aspects. Many modifications and variations can be made, as will be apparent to those skilled in the art. Functionally equivalent methods and apparatuses within the scope of the disclosure, in addition to those enumerated herein, will be apparent to those skilled in the art from the foregoing descriptions. For example, many of the elements that are described are functional entities that may be implemented as discrete or distributed components or in conjunction with other components, in any suitable combination and location. Such modifications and variations are intended to fall within the scope of the appended claims, along with the full scope of equivalents to which such claims are entitled.

What is claimed is:

1. A zero crossing detection circuit that identifies a true zero crossing of an alternating power signal, said circuit comprising:
    a conditioning circuit for receiving an alternating power signal from a power source;
    a comparator operatively coupled to said conditioning circuit, said comparator generating a discrete output signal representative of said power signal;
    a zero crossing detection controller operatively coupled to said comparator,
    said zero crossing detection controller identifying a true zero crossing from said discrete output signal,
    wherein said conditioning circuit comprises a low pass filter, said low pass filter removing high-frequency noise from said power signal.

2. The zero crossing detection circuit of claim 1 wherein said conditioning circuit further comprises a voltage regulator.

3. The zero crossing detection circuit of claim 1 wherein said comparator is further configured to receive a threshold input.

4. The zero crossing detection circuit of claim 3 wherein said threshold input comprises a voltage signal comprising approximately 0 Volts to approximately 5 Volts.

5. The zero crossing detection circuit of claim 1 wherein an output of said comparator comprises a square wave.

6. The zero crossing detection circuit of claim 1 wherein an output of said comparator comprises an appropriate signal when said output of said conditioning circuit is not equal to said threshold voltage.

7. The zero crossing detection circuit of claim 6 wherein said zero crossing detection controller comprises a sampling circuit, said sampling circuit samples said square wave signal received from said comparator.

8. The zero crossing detection circuit of claim 1
    wherein said circuit comprises a portion of a controller,
    wherein said controller comprises an automatic switch, and
    wherein said controller comprises a pump controller.

9. The zero crossing detection controller of claim 1 comprising
    a processor;
    a time stamp counter;
    an up/down counter; and
    a memory.

* * * * *